United States Patent [19]
Terasawa et al.

[11] Patent Number: 5,331,369
[45] Date of Patent: Jul. 19, 1994

[54] METHOD OF FORMING PATTERNS AND APPARATUS FOR CARRYING OUT THE SAME

[75] Inventors: Tsuneo Terasawa, Oume; Katsunobu Hama, Katsuta; Soichi Katagiri, Hachioji, all of Japan

[73] Assignee: Hitachi, Ltd., Tokyo, Japan

[21] Appl. No.: 50,324

[22] PCT Filed: Sep. 21, 1992

[86] PCT No.: PCT/JP92/01200

§ 371 Date: May 18, 1993

§ 102(e) Date: May 18, 1993

[87] PCT Pub. No.: WO93/06618

PCT Pub. Date: Jan. 4, 1993

[30] Foreign Application Priority Data

Sep. 20, 1991 [JP] Japan ................................. 3-241810
Dec. 25, 1991 [JP] Japan ................................. 3-342556

[51] Int. Cl.$^5$ ...................... G03B 27/42; G03B 27/72; G03B 27/28
[52] U.S. Cl. ........................................ 355/53; 355/71; 355/125
[58] Field of Search ........................... 355/53, 71, 125; 356/401

[56] References Cited

U.S. PATENT DOCUMENTS

| | | | |
|---|---|---|---|
| 5,140,366 | 8/1992 | Shiozawa et al. | 355/53 |
| 5,144,362 | 9/1992 | Kamon et al. | 355/53 |
| 5,184,196 | 2/1993 | Nakagawa et al. | 356/401 |
| 5,194,893 | 3/1993 | Nishi | 355/53 |
| 5,253,040 | 10/1993 | Kamon et al. | 356/399 |
| 5,262,822 | 11/1993 | Kosugi et al. | 355/53 |

FOREIGN PATENT DOCUMENTS

| | | |
|---|---|---|
| 60-78454 | 5/1985 | Japan . |
| 60-168112 | 8/1985 | Japan . |
| 61-290306 | 12/1986 | Japan . |
| 1-262624 | 10/1989 | Japan . |

Primary Examiner—Richard A. Wintercorn
Attorney, Agent, or Firm—Fay, Sharpe, Beall, Fagan, Minnich & McKee

[57] ABSTRACT

A method of forming patterns and an apparatus for carrying out the same whereby semiconductor integrated circuits and the like are manufactured using reduction projection alignment. The invention primarily involves projecting patterns of a first substrate onto the surface of a second substrate via an optical projector to form a projection image of the patterns on the second substrate surface. A phase difference pattern is furnished on the plane or its equivalent where the patterns of the first substrate are located. The phase difference pattern affords a predetermined phase difference to the light passing therethrough. Light is irradiated at the phase difference pattern via the optical projector to project the phase difference pattern onto a detecting plane in the position equivalent to the surface of the second substrate. This forms a projection image of the phase difference pattern on the detecting plane. An optical detector is used to detect the light intensity distribution of the projection image of the phase difference pattern projected onto the detecting plane. The detected light intensity distribution is represented by detection signals which are processed so as to obtain the relative positional relationship between the focal plane of the patterns and the detecting plane by use of the optical projector. Finally, the position of the second substrate is controlled so that the position of the detecting plane coincides with that of the focal plane on the basis of the relative positional relationship obtained.

9 Claims, 10 Drawing Sheets

METHOD OF FORMING PATTERNS AND APPARATUS FOR CARRYING OUT THE SAME

BACKGROUND OF THE INVENTION

1. Field of the Invention

The present invention relates to a method of forming patterns and an apparatus for carrying out the same whereby fine patterns are formed easily and with precision. More particularly, the invention relates to a method of forming patterns and an apparatus for carrying out the same in conjunction with the manufacture of large scale integrated circuits (LSI's) by use of projection aligner.

2. Description of the Prior Art

Fine patterns of semiconductor integrated circuits and the like are formed by the so-called reduction projection aligner. What the aligner does is to project by exposure, on a reduced scale, circuit patterns drawn on a mask or reticle (both are generically referred to as the reticle) onto a substrate (generally called the wafer) through an exposure lens. The circuit pattern image must be focused on the wafer surface precisely, i.e., with a good resolution. Recently developed reduction projection aligners tend to have greater numerical aperture (NA) than earlier models. The reason for this improvement is to further reduce optically printable line widths (below the submicron order). The novel capability involves reduced practical depths of focus of the projection lens. This means a greater need for more precise alignment of the projection image plane (focal plane) with the wafer surface. That precise alignment needs to be achieved by aligners equipped with a focusing function.

One such aligner with the focusing function is disclosed illustratively in Japanese Patent Laid-Open No. SHO/60-168112. The disclosed apparatus varies the distance between wafer and projection lens in the optical axis direction to obtain the best focal plane through detection. Another aligner with the focusing function is disclosed in Japanese Patent Laid-Open No. SHO/61-290306. This apparatus involves initially forming interference fringes on the wafer by use of two light beams and then varying the distance between wafer and projection lens in the optical axis direction so as to obtain the plane where the diffracted light intensity from the wafer is the highest. Another aligner with the focusing function, disclosed in Japanese Patent Laid-Open No. HEI/1-262624, illuminates fiducial marks at different incident angles using two light beams of different polarization characteristics. The projected images of the fiducial marks are used to scan reticle marks. The resulting position error in the scanning direction allows a focal error to be calculated, whereby correct focusing is achieved. Yet another aligner with the focusing function is disclosed in Japanese Patent Laid-Open No. SHO/60-78454. The apparatus first calculates the accumulated amount of heating in the projection lens arrangement caused by the incident light irradiated thereto. The calculated amount of heating is used to vary the air pressure in the enclosed space within the projection lens arrangement so as to obtain the best focal plane.

The apparatus disclosed in Japanese Patent Laid-Open No. SHO/60-168112 requires shifting the wafer bit by bit in the optical axis direction. In each of the slightly shifted positions, the wafer marks need to be detected and their image contrasts obtained. Although the amount of focal error is accurately detected and the error is compensated with high reliability, it takes time for the apparatus to attain correct focusing. This tends to reduce the throughput of the apparatus. The apparatus disclosed in Japanese Patent Laid-Open No. HEI/1-262624 offers improved levels of throughput because it detects the amount of focal error from the detected marks based on a single scan using two light beams of different incident angles. However, this apparatus cannot secure a sufficiently large difference between the two incident angles because it illuminates the fiducial marks at these angles using P and S waves obtained by passing the light through divided polarizers at the fiber tip. Furthermore, because the P and S waves are detected with two different detectors for comparison, the detectors may develop a detection error that stems from their potentially different detection characteristics. This adversely affects the reliability of the detected results.

The apparatus disclosed in Japanese Patent Laid-Open No. SHO/60-78454 compensates any focal plane error by calculating the amount of focal error based on the accumulated amount of heating in the projection lens arrangement. One disadvantage of this apparatus is that it is difficult to ascertain whether correct focusing is really attained. Minute and unpredictable ambient changes can lead to a focusing error, which cannot be compensated. This has a detrimental effect on the reliability of the apparatus.

As described, most prior art aligners with the automatic focusing function have been deficient in calibrating the operating conditions of the focusing mechanism by detecting precisely and quickly that focal plane of the projection optics which changes over time, and in accurately positioning the wafer surface to the correct focal plane under the calibrated operating conditions.

SUMMARY OF THE INVENTION

It is therefore a general object of the present invention to provide a method of forming patterns and an apparatus for carrying out the same whereby fine patterns are formed easily and with precision without throughput deterioration. A more specific object of the invention is to provide a method of forming patterns and an apparatus for carrying out the same, wherein the operating conditions of an automatic focusing mechanism are calibrated by detecting precisely and quickly the focal plane of projection optics for pattern formation, and wherein the wafer surface is accurately positioned to the correct focal plane under the calibrated operating conditions.

In carrying out the invention and according to one aspect thereof, there is provided a pattern forming method for projecting reticle patterns of a first substrate (reticle) onto the surface of a second substrate (wafer) via optical projection means in order to form a projection image of the reticle patterns on the second substrate surface. The method comprises the steps of furnishing a phase difference (shifter) pattern on the first substrate or its equivalent plane, the phase difference pattern being arranged partially to vary the phase of the light passing therethrough; irradiating light at the phase difference pattern via the optical projection means to project the phase difference pattern onto a detecting plane in the position corresponding to the surface of the second substrate, thus forming a projection image of the phase difference pattern on the detecting plane before the reticle patterns are projected onto the surface of the second substrate; detecting by use of optical detection means the light intensity distribution of the projection image of the phase difference pattern projected onto the detecting plane, the detected light intensity distribution representing a phase difference dependency; obtaining the relative positional relationship between the focal plane of the optical projection means and the detecting plane in accordance with the phase difference dependency; and compensating the position of the second substrate relative to the optical projection means so that the position of the detecting plane coincides precisely with the position of the focal plane of the optical projection means.

According to another aspect of the invention, there is provided a pattern forming apparatus for use with the pattern forming method outlined above. The pattern forming apparatus comprises optical projection means for projecting reticle patterns of a first substrate (reticle) onto a second substrate (wafer), the first substrate or the equivalent thereof having a phase difference pattern arranged partially to vary the phase of the light passing therethrough; optical detection means for detecting the light intensity distribution of a projection image of the phase difference pattern, the projection image being obtained by projecting the phase difference pattern via the optical projection means onto a detecting plane located in the position equivalent to the second substrate, the detected light intensity distribution representing a phase difference dependency; means for obtaining the relative positional relationship between the focal plane of the optical projection means and the detecting plane on the basis of the phase difference dependency of the detected light intensity distribution; and means for compensating the position of the second substrate relative to the optical projection means on the basis of the obtained relative positional relationship so that the position of the detecting plane coincides precisely with the position of the focal plane of the optical projection means.

The position equivalent to the first substrate is any position on the plane which is outside the first substrate (reticle), which is perpendicular to the optical axis of the optical projection means such as the projection lens, and which contains the reticle pattern plane on the first substrate. That position may illustratively be established on a stage that supports the first substrate. The position equivalent to the second substrate is any position on the plane which is outside the second substrate (wafer), which is perpendicular to the optical axis of the optical projection means such as the projection lens, and which contains the surface of the second substrate.

The phase difference pattern mentioned above is constituted by locating, on the first substrate (reticle) or in the position equivalent thereto, a plurality of clear apertures arranged adjacent to one another, each clear aperture causing the phase of a light beam passing therethrough (projection light beam) to shift by a different amount. The light beams passing through the plurality of clear apertures form a projection image of the phase difference pattern. When the projection image is in focus, the light intensity distribution of the projection image manifests symmetrical changes across the right- and left-hand sides of each boundary between adjacent clear apertures; when the projection image is out of focus, the light intensity distribution indicates asymmetrical changes across the right- and left-hand sides of the same boundary. This phenomenon is what the current invention takes advantage of. The asymmetric light intensity distribution appears only when the phase difference between transmitting beams of adjacent clear apertures is other than 180 degrees. For example, suppose that adjacent clear apertures are arranged on the reticle so as to afford 120 and 240 degrees of phase shift relative to one another. In the light intensity distribution of the projection image (transmitted light image) on a positively defocused plane in the above setup, the intensity of light passing through the 120-degree shifting clear aperture is higher in peak value than the intensity of light passing through the 240-degree shifting clear aperture. Conversely, in the light intensity distribution of the projection image on a negatively defocused plane, the intensity of light passing through the 240-degree shifting clear aperture is higher in peak value than the intensity of light passing through the 120-degree shifting clear aperture. That is, when peak values in the light intensity distribution of the projection image from the phase difference pattern are detected by image sensor, it is possible immediately to know whether the positively or negatively defocused state is currently in effect. In other words, it is possible to know the direction in which to compensate the wafer position in order to attain the focused state. If the relationship between the peak-to-peak difference and the amount of focal error is verified in advance, the amount of the current focal error is known from the peak value observations. The wafer position is corrected accordingly, whereby the precisely focused state is achieved. In the description above, the positively defocused state refers to a state in which the focal plane of the projection image formed by the optical projection means is located on the upstream side (i.e., reticle side) of the detecting plane; the negatively defocused state is a state in which the focal plane of the projection image formed by the optical projection means is located on the downstream side of the detecting plane.

In a preferred constitution according to the invention, there is provided a pattern forming method for projecting reticle patterns of a first substrate (reticle) onto the surface of a second substrate (wafer) via optical projection means in order to form a projection image of the reticle patterns on the second substrate surface. The method comprises the steps of furnishing a focusing pattern on the first substrate or in the position equivalent thereto, the focusing pattern having two pattern portions, one pattern portion affording a phase difference to the light passing therethrough, the other pattern portion affording no phase difference to the passing light; irradiating oblique illumination at the focusing pattern of the first substrate via the optical projection means to project the focusing pattern onto a detecting plane in the position equivalent to the second substrate, thus forming a projection image of the focusing pattern on the detecting plane before the reticle patterns are projected onto the surface of the second substrate; detecting the amount of image shift between the image from the pattern portion affording the phase difference and the image from the pattern portion affording no phase difference; obtaining the relative positional relationship between the focal plane of the optical projection means and the detecting plane in accordance with the detected amount of image shift; and compensating the position of the second substrate so that the position of the detecting plane coincides precisely with the position of the focal plane of the optical projection means.

In another preferred constitution according to the invention and in conjunction with the above-mentioned preferred pattern forming method, there is provided a pattern forming apparatus for projecting reticle patterns of a first substrate (reticle) onto the surface of a second substrate (wafer) via optical projection means in order to form a projection image of the reticle patterns on the second substrate surface. The apparatus comprises a focusing pattern located on the first substrate or in the position equivalent thereto, the focusing pattern having two pattern portions, one pattern portion affording a phase difference to the light passing therethrough, the other pattern portion affording no phase difference to the passing light; illumination means for illuminating the focusing pattern via the optical projection means to project the focusing pattern onto a detecting plane in the position equivalent to the second substrate, thus forming a projection image of the focusing pattern on the detecting plane; means for adjusting the incidence angle of the illumination from said illumination means with respect to the focusing pattern; means for detecting from the projection image the amount of image shift between the image from the pattern portion affording the phase difference and the image from the pattern portion affording no phase difference; means for obtaining the relative positional relationship between the focal plane of the optical projection means and the detecting plane in accordance with the detected amount of image shift; and means for compensating the position of the second substrate so that the position of the detecting plane coincides precisely with the position of the focal plane of the optical projection means.

The above-mentioned focusing pattern is basically composed of line pattern parts (long and narrow band-like opaque parts) and space pattern parts (long and narrow band-like clear parts) arranged alternately adjacent to one another, thus constituting a fringe pattern. A predetermined portion of the fringe pattern (the pattern portion which affords the phase difference) contains a phase shifter that shifts the phase of the passing light by 180 degrees to a specific part of the space pattern. When the focusing pattern is illuminated by the obliquely entering light from the illumination incident angle adjusting means, a projection image of the focusing pattern is formed on the detecting plane. When the focal plane of the optical projection means and the detecting plane are in a focused state, there occurs in the projection image no relative image shift between the image part from the pattern portion affording the phase difference and the image part from the pattern portion affording no phase difference; when the focal plane of the optical projection means and the detecting plane are in a defocused state, there occurs a relative image shift between the two image parts of the projection image. It is possible to know from the direction of image shift whether the defocused state is on the positive or negative side. In addition, the amount of image shift allows the amount of defocus (focal error) to be known.

The image shift amount detecting means may include a first light detector for detecting that part of the projection image which corresponds to the focusing pattern portion affording the phase difference to the transmitting light; a second light detector for detecting that part of the projection image which corresponds to the focusing pattern portion affording no phase difference to the transmitting light; and means for detecting the amount of image shift between images from the two focusing pattern portions based on the amount of phase shift between detection outputs from the first and the second light detectors. The means for obtaining the relative positional relationship between the focal plane of the optical projection means and the detecting plane may be constituted by calculation means for calculating the above relationship based on the amount of image shift obtained by the image shift amount detecting means. The set of the first and the second light detectors may be composed of a single two-dimensional dimensional image sensor (e.g., 2-D CCD) in front of which a magnifying optics is located.

These and other objects, features and advantages of the invention will become more apparent upon a reading of the following description and appended drawings.

DESCRIPTION OF THE PREFERRED EMBODIMENTS

The preferred embodiments of the invention will now be described with reference to the accompanying drawings.

First Embodiment

Figure 1:
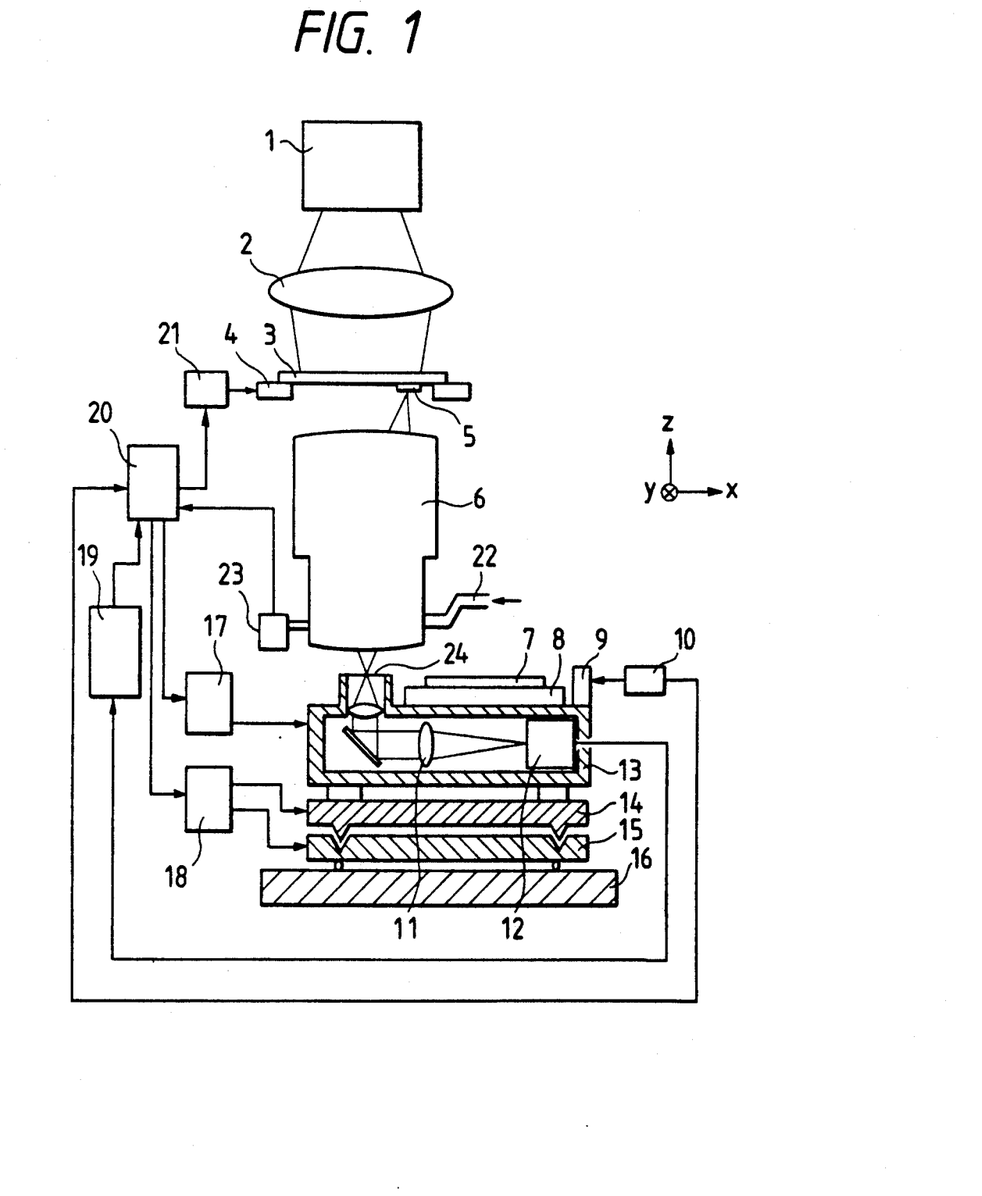
FIG. 1 is a block diagram of a pattern forming apparatus practiced as a first embodiment of the invention.

FIG. 1 is a block diagram of a reduction projection aligner (i.e., pattern forming apparatus) practiced as the first embodiment of the invention. In FIG. 1, an exposure light beam from a source 1 passes through a condenser lens 2 to illuminate a reticle 3 on which circuit patterns such as semiconductor integrated circuits are drawn. The reticle 3, supported by a reticle stage 4, is positioned within an X-Y plane by driving means 21 moving the reticle stage 4 within that plane.

The illumination light is diffracted by the circuit patterns on the reticle 3 and projected via a reduction projection lens 6 onto a wafer 7. The circuit patterns on the reticle 3 are thus projected on a reduced scale onto the wafer 7. This forms (i.e., transcribes) a projection image of the circuit patterns of the reticle 3 on the wafer 7.

The wafer 7 is fixedly mounted on a wafer stage 8. In turn, the wafer stage 8 is mounted securely on a stage 13 that is moved in the Z axis direction (i.e., direction of optical axis of reduction projection lens 6) by stage driving means 17. The stage 13 is mounted on stages 14 and 15 which are moved in the Y and X axis directions (both perpendicular to Z axis), respectively, by the driving means 18. Operating the driving means 17 and 18 moves the wafer 7 at a predetermined pitch in a three-dimensional manner. This allows the wafer 7 to be positioned in the X and Y axis directions and focused in the Z axis direction with respect to the reduction projection lens 6. With the wafer 7 positioned and focused suitably for exposure, the circuit patterns drawn on the reticle 3 are transferred onto the entire surface of the wafer 7. The position of the wafer stage 8 is measured accurately in the X and Y axis directions with a laser interferometer 10. The driving means 18 is subject to feedback control of a controller 20 so that the difference between the measured position and the target position becomes zero. Thus when the target position to which to transfer the circuit patterns is determined on the wafer surface, the stages 14 and 15 are position precisely in the X and Y axis directions.

In FIG. 1, an air supply source 22 and a pressure sensor 23 constitute a conventional focusing mechanism. In operation, the air supply source 22 feeds air pressure between the lower surface of the reduction projection lens 6 and the upper surface of the wafer 7. With the air pressure detected by the pressure sensor 23, the position of the stage 13 is controlled in the Z axis direction so that the air pressure remains steady. This mechanism keeps constant the distance between the lower surface of the reduction projection lens 6 and the upper surface of the wafer 7.

The constitution and operation of the first embodiment described above are the same as those of the typical conventional pattern forming apparatus. Below is a detailed description of how an automatic focusing compensation mechanism featuring the embodiment is constructed and how it works.

In FIG. 1, the light from the source 1 illuminates a phase difference pattern 5 provided on the reticle 3, forming a projection image of the pattern 5 through the reduction projection lens 6 onto a detecting plane 24 in the position equivalent to the wafer surface on the stage 13. The projection image of the phase difference pattern 5 is magnified by a factor of about 400 through a magnifying lens 11 before the image is formed in an image sensor 12. The detecting plane 24 is positioned on a plane which is perpendicular to the optical axis of the lens 6 and which contains the surface (exposure plane) of the wafer 7.

Figure 2:
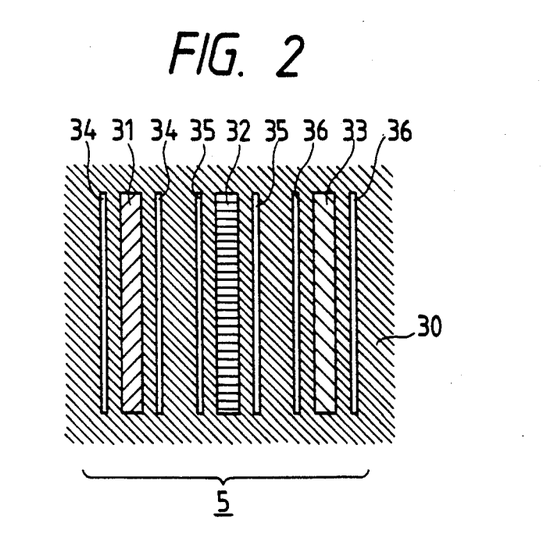
FIG. 2 is a view of a typical phase difference pattern for use with the first embodiment.

FIG. 2 shows a typical phase difference pattern 5 provided on the reticle 5. The phase difference pattern 5 is made of a plurality of clear apertures 31–36 formed within an opaque region 30. Of these clear apertures, the ones on the narrower side 34, 35 and 36 have their widths formed a little narrower than a critical dimension (i.e., minimum feature size) that can be optically resolved by the reduction projection lens 6; the apertures on the wider side 31, 32 and 33 have their widths formed a little wider than the minimum feature size. It follows that only images from the wider clear apertures 31, 32 and 33 are projected as an isolated space pattern each onto the detecting plane 24.

Figure 3:
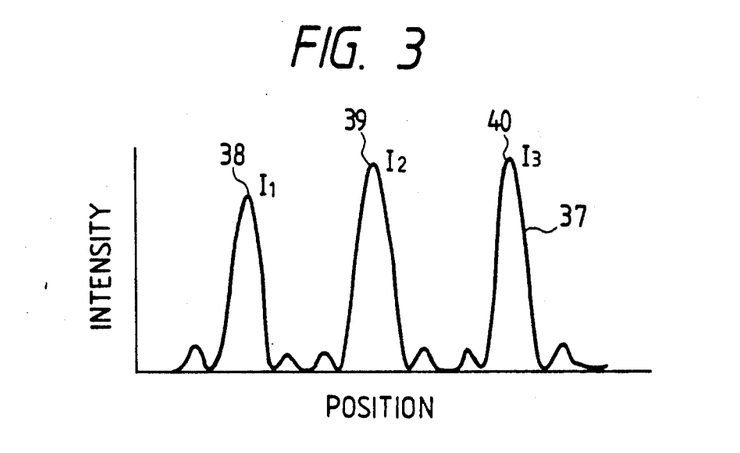
FIG. 3 is a graphic representation indicating typical light intensity distribution of a phase difference pattern image formed by the light passing through the phase difference pattern of FIG. 2.

While the narrower clear apertures 34, 35 and 36 are simply apertures, the wider clear apertures 31, 32 and 33 have a shifter of a different thickness each. The thicknesses of the shifters are set so that the light passing through the aperture 31 has a phase difference of 120 degrees with respect to the light passing through the aperture 34, that the light passing through the aperture 32 has a phase difference of 180 degrees with respect to the light passing through the aperture 35, and that the light passing through the aperture 33 has a phase difference of 240 degrees with respect to the light passing through the aperture 36. The shifters are made of a silicon dioxide ($SiO_2$) film. The image sensor 12 provides a light intensity distribution image 37 having three peaks 38, 39 and 40, as shown in FIG. 3. In FIG. 3, reference characters $I_1$, $I_2$ and $I_3$ stand for the transmitted light intensity peak values corresponding to the clear apertures 31, 32 and 33.

Figure 4:
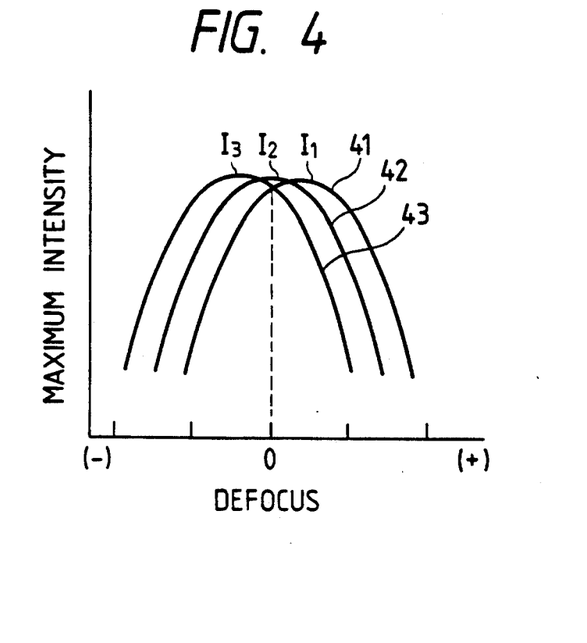
FIG. 4 is a graphic representation depicting how light intensity peaks of the phase difference pattern image vary depending on the focal plane error.

FIG. 4 graphically depicts how the light intensity peak values $I_1$, $I_2$ and $I_3$ of the phase difference pattern image are related to the focal plane error. Since the light beams passing through the clear apertures 31, 32 and 33 are given a phase difference each, the peak values $I_1$, $I_2$ and $I_3$ vary along curves 41, 42 and 43, respectively, as the position of the detecting plane 24 on the stage 13 varies relative to the focal plane of the transmitted light image. Specifically, the peak value $I_2$ of the transmitted light beam having the phase difference of 180 degrees changes symmetrically with respect to the focused position (0), as shown by the curve 42. The other light beams with their phase differences of 120 and 240 degrees have their peak values $I_1$ and $I_3$ changed asymmetrically with respect to the focused position (0). This means that when the detecting plane 24 is exactly in the focused position (0), the peak values $I_1$ and $I_3$ become the same. If there occurs a positive defocus (i.e., the focal plane of the lens 6 located upstream of (i.e., above) the detecting plane 24), the peak value $I_1$ becomes greater than the peak value $I_3$. In case of a negative defocus (i.e., the focal plane of the lens 6 located downstream of (i.e., below) the detecting plane 24 ), the peak value $I_3$ becomes greater than the peak value $I_1$. The peak values $I_1$, $I_2$ and $I_3$ are first read from a light intensity signal obtained by the image sensor 12. These values are then calculated by a calculation part 19 using the formula $(I_1 - I_3)/I_2$ The result takes a monotonous relationship relative to the changes in the defocus (i.e., amount of shift between detecting plane 24 and focal plane), as represented by a curve 44 in FIG. 5.

Figure 5:
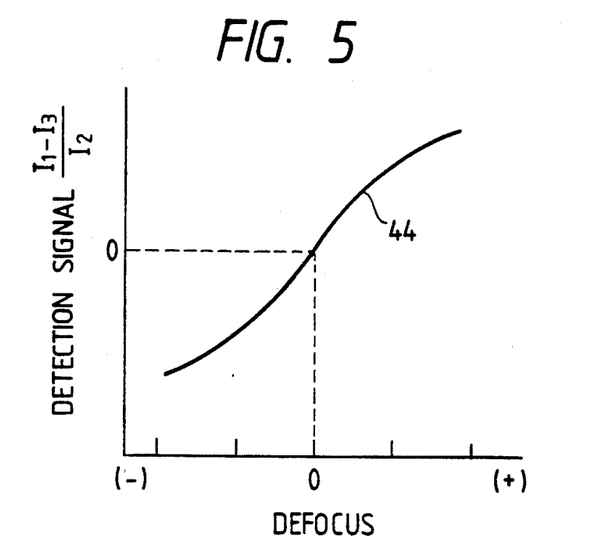
FIG. 5 is a graphic representation showing the characteristic of a typical focal point detection signal for use with the first embodiment.

The relationship between the value of $(I_1-I_3)/I_2$ and the defocus is obtained beforehand. When the peak values $I_1$, $I_2$ and $I_3$ are detected, they are placed in the above formula $(I_1-I_3)/I_2$ for calculation. From the calculated value, the defocus is uniquely known. In practice, the conventional focusing mechanism made of the air supply source 22 and pressure sensor 23 is first used to perform initial focusing. Then the value of $(I_1-I_3)/I_2$ is calculated, whereby the adjustment error in the focusing mechanism is immediately known. Thereafter, appropriate compensation data are sent to the driving means 17 of the stage 13 moving in the Z axis (optical axis) direction so that the wafer 7 is corrected into focus in the Z axis direction. With the focusing compensation completed, the light intensity distribution of the projection image from the pattern 5 is again measured. From the projection image obtained, the three peaks are derived and placed in the formula $(I_1-I_3)/I_2$ to see if the formula yields zero. A zero result verifies that the focusing mechanism has been correctly calibrated.

Figure 6:
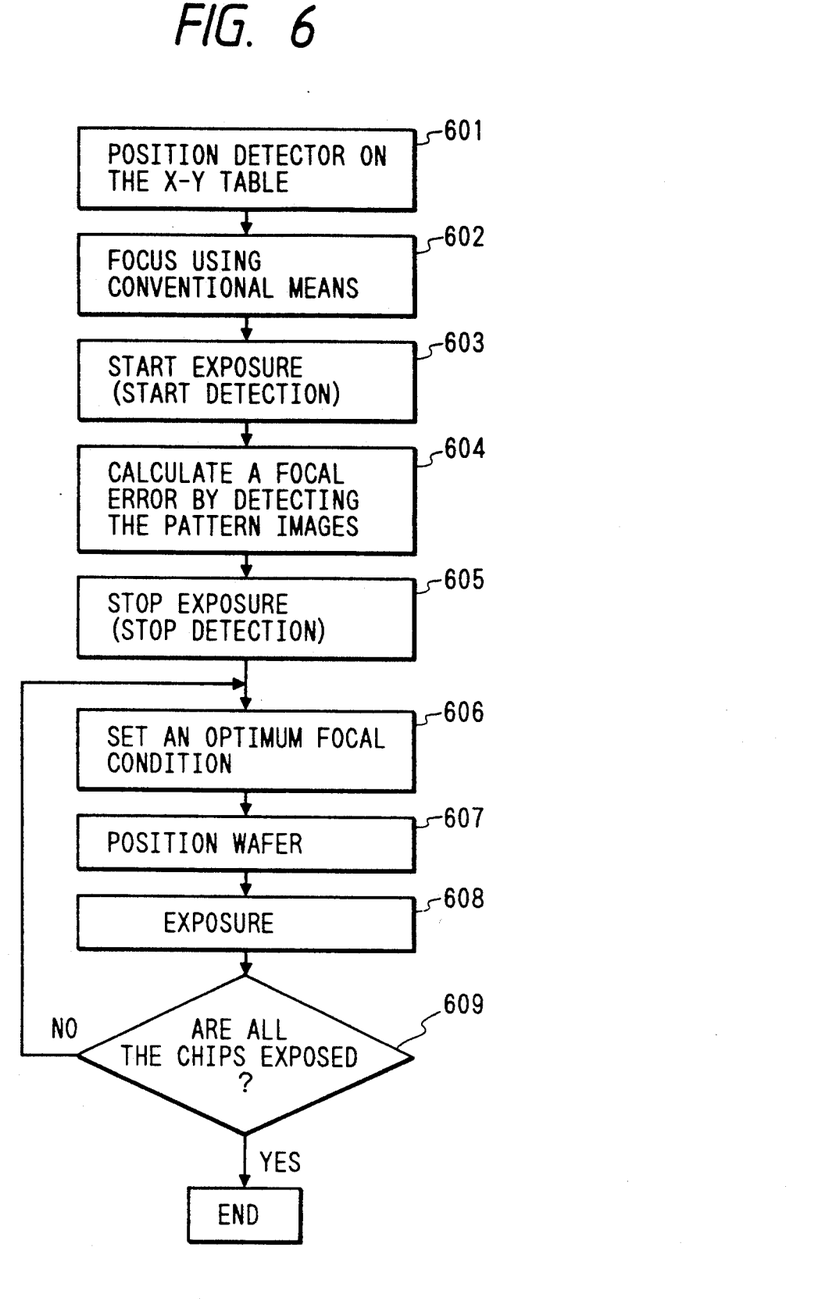
FIG. 6 is a flowchart of steps constituting a pattern forming method used in conjunction with the first embodiment.

FIG. 6 is a flowchart of typical steps constituting a pattern forming method used in conjunction with the first embodiment. Specifics of each step are described below.

In step 601, the driving means 17 and 18 position the X, Y and Z stages 15, 14 and 13 so that the detecting plane 24 on the Z stage 13 comes into position under the reduction projection lens 6.

In step 602, the conventional focusing means made of the air supply source 22 and pressure sensor 23 controls the stage 13 in the Z axis direction so that the distance between reduction projection lens 6 and detecting plane 24 remains constant.

In step 603, the shutter of the illumination optics of the embodiment is opened for the phase difference pattern 5. In step 604, the image of the phase difference pattern projected onto the detecting plane 24 is detected and the defocus involved is obtained accordingly.

In step 605, the shutter of the illumination optics is closed for the phase difference pattern 5. In step 606, the focusing mechanism is calibrated so as to eliminate the defocus found in step 604, and the surface of the wafer 7 is positioned in the Z axis direction on the best focal plane of the reduction projection lens 6.

In step 607, the driving means 18 moves the wafer 7 in the X and Y axis directions so that the wafer 7 comes into position under the reduction projection lens 6. In step 608, the circuit patterns on the reticle 3 are projected and exposed onto the surface of the wafer 7.

In step 609, a check is made to see if it is necessary to repeat steps 606 through 608 for exposure and projection of another region of a plurality of circuit patterns onto the wafer 7. The steps are repeated until the entire surface of the wafer 7 is exposed to the patterns. The calibration of the automatic focusing mechanism in step 606 need not be performed in every pass repeated; it may be carried out as needed depending on the change in ambient conditions.

Figure 7:
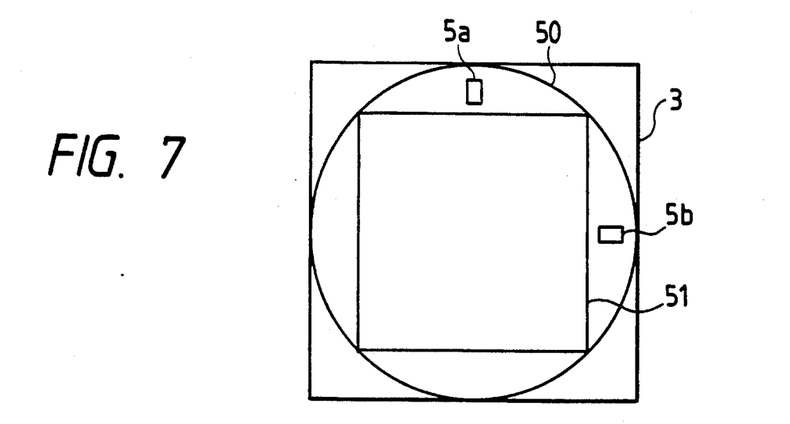
FIG. 7 is a view of a typical reticle for use with the first embodiment.

FIG. 7 shows a typical reticle (i.e., mask) for use with the first embodiment. The phase difference pattern 5 giving the phase difference to the passing light is located inside a region 50 (on the pattern surface of the reticle 3) on which an image is projected by the reduction projection lens 6, and outside a region 51 on which the circuit device patterns are drawn. As shown in FIG. 7, the pattern 5 may be positioned at 5a and 5b. Where the inside of the projection region 50 is contacted from below by the stage 4 supporting the reticle 3, the phase difference pattern 5 may be provided on the supporting surface of the stage 4. In this setup, the reticle portion above the phase difference pattern 5 and the supporting portion of the stage 4 below the pattern 5 may be constructed to be transparent.

Figure 8:
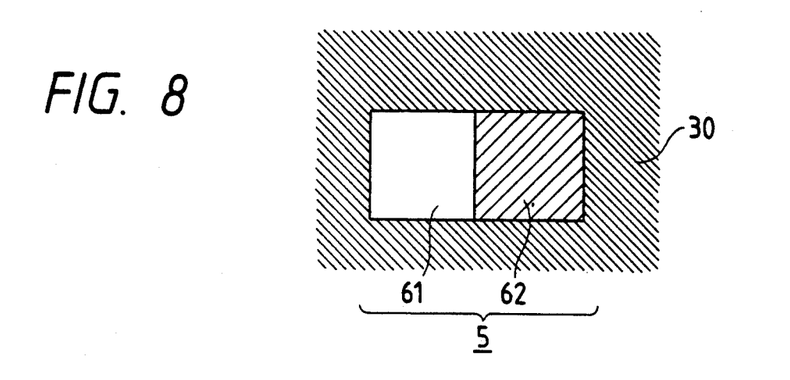
FIG. 8 is a view of another phase difference pattern for use with the first embodiment.

The phase difference pattern 5 affording a plurality of phase differences to the passing light is not limited to the pattern arrangement shown in FIG. 2. Alternatively, as shown in FIG. 8, two apertures 61 and 62 may be provided adjacent to each other inside an opaque region 30. The pattern may be arranged so that the light passing through the aperture 62 illustratively has a phase difference of 120 degrees relative to the light passing through the aperture 61. In this arrangement, the aperture 61 may either afford no phase shift to the light passing therethrough or may give an appropriate phase shift to the passing light. What is important is that the phase difference between the apertures 61 and 62 is to be held at 120 degrees. The light intensity distribution of the projection image from the above setup has two peak values corresponding to the apertures 61 and 62. The two peak values match when focusing is achieved correctly. Thus comparing the two peak values permits calibration of the focal plane. Although the phase difference between the two apertures is set at 120 degrees in FIG. 8, the phase difference may be any value except 180 degrees. Another alternative is to provide three or more apertures having suitable phase differences therebetween.

Figure 9:
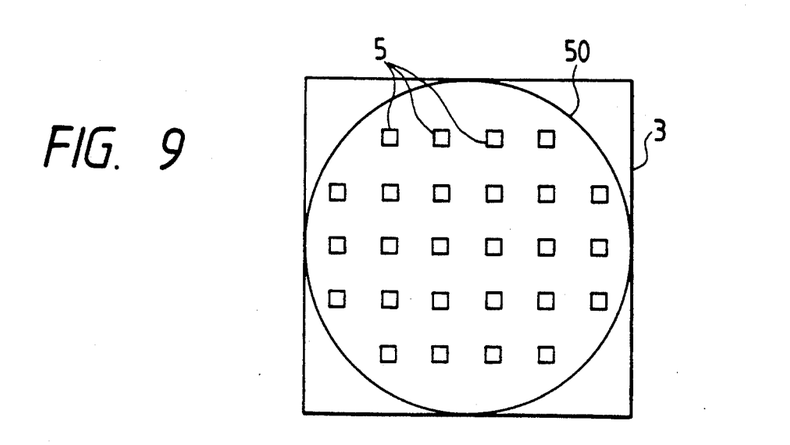
FIG. 9 is a view of another reticle for use with the first embodiment.

The focal plane detecting mechanism of the invention described above allows the shape of the focal plane on the projection lens 6 to be known. Specifically, as depicted in FIG. 9, a plurality of phase difference patterns 5 are arranged at an appropriate distance apart on the reticle 3. With the stage 13 fixed in the Z axis direction, the stages 14 and 15 are moved in the X and Y axis directions. This makes it possible to detect the focal point error (i.e., deviation of the focal plane relative to the detecting plane 24) over the entire image field of the projection lens 6. When the detected focal point error is expressed as a function of the X and Y coordinates of the stages 14 and 15, the function provides a three-dimensional shape of the focal plane on the projection lens.

When the shapes of the focal plane of the projection lens 6 are obtained from the projection images of the multiple phase difference patterns, the focal plane shapes are processed statistically to obtain the best focal plane. The data about the best focal plane are used to calibrate the focusing mechanism. This setup makes it possible to calibrate the focusing mechanism more accurately than if only the data about the phase difference patterns 5a and 5b outside the circuit pattern region 51 (see FIG. 7) were used for calibration. This provides for appreciably more accurate focusing.

In the first embodiment discussed above, the illumination optics for illuminating the phase difference pattern 5 is also used to transfer circuit device patterns onto the wafer. Alternatively, a dedicated illumination optics for illuminating the phase difference pattern 5 may be furnished above the reticle 3. Where necessary, a mechanism may be provided to move the dedicated illumination optics away from the optical axis of the illumination optics (i.e., reduction projection lens 6) for pattern projection.

Second Embodiment

Figure 10:
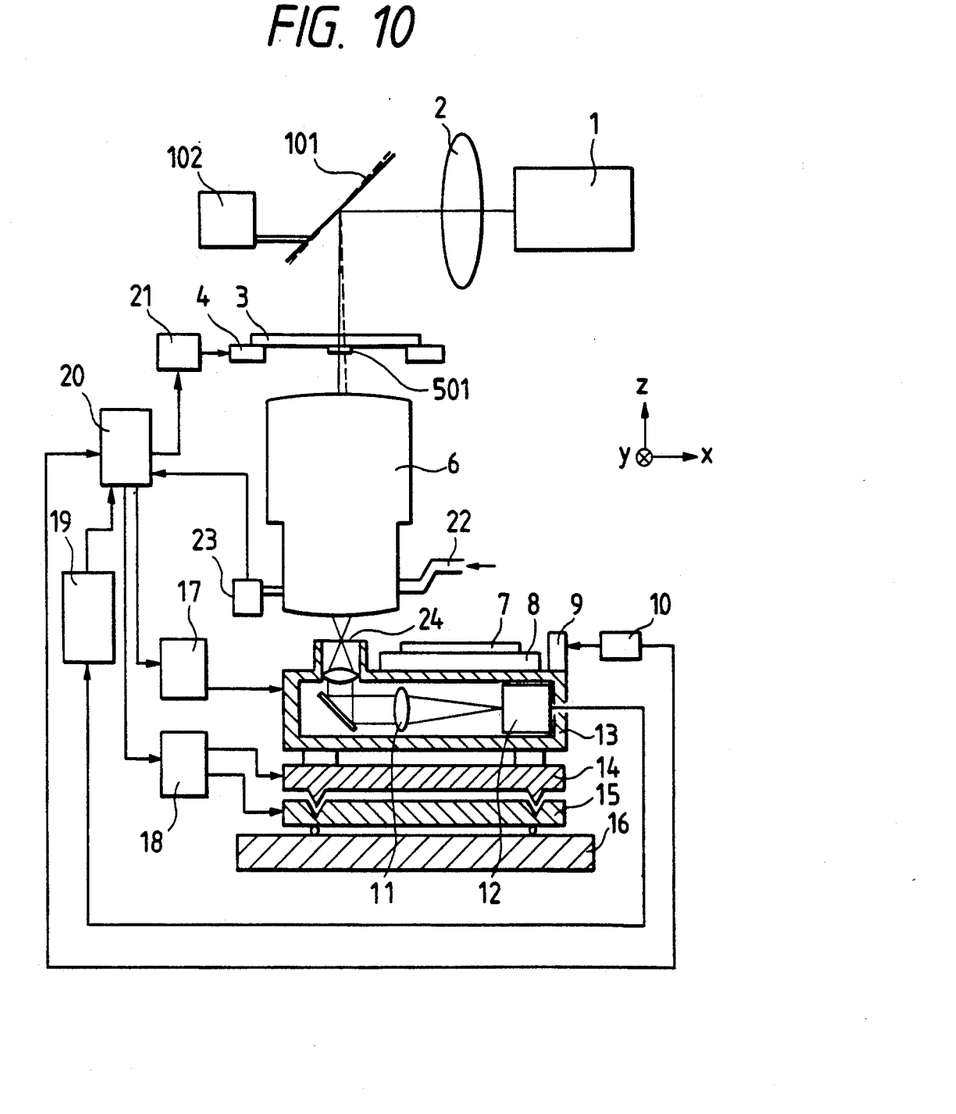
FIG. 10 is a block diagram of a pattern forming apparatus practiced as a second embodiment of the invention.

FIG. 10 is a block diagram of a reduction projection aligner (i.e., pattern forming apparatus) practiced as the second embodiment of the invention. In FIG. 10, the light from a source 1 is concentrated by a condenser lens 2 and irradiated via a plane mirror 101 at a phase difference pattern 501 provided under a reticle 3. The light that passed through the phase difference pattern 501 is focused by a reduction projection lens 6 onto a detecting plane 24 furnished on a stage 13. That is, a reduced projection image of the phase difference pattern 501 is formed on the detecting plane 24. Needless to say, the detecting plane 24 is provided on the same plane as the surface of a wafer 7. The reduced projection image of the phase difference pattern 501 formed on the detecting plane 24 is magnified by a magnifying optics 11 contained in a Z stage 13 before the image is formed in an image sensor 12. The image sensor 12 in this setup is a two-dimensional image sensor (e.g., 2-D CCD). The stages for supporting the wafer 7 and the focusing mechanism are the same as those of the first embodiment in FIG. 1.

Figure 11:
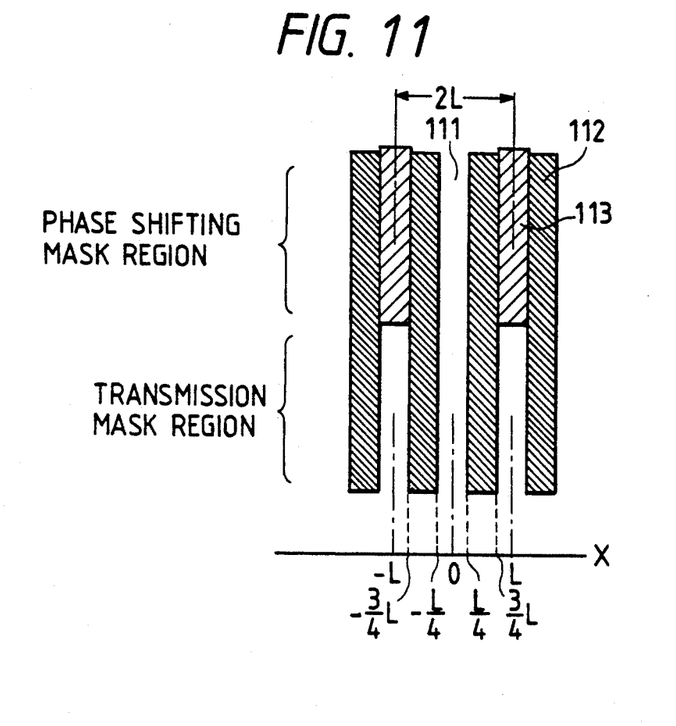
FIG. 11 is a view of a typical phase difference pattern for use with the second embodiment.

FIG. 11 depicts a typical phase difference pattern for use with the second embodiment. As illustrated, this phase difference pattern 501 is a fringe pattern comprising line parts (opaque) 112 and space parts (clear) 111 provided on the reticle 3. The upper half of the pattern 501 has every other space part 111 furnished with a phase shifter 113 for 180-degree phase shift. The upper half of the pattern 501 with the phase shifters is called a phase shifting mask region; the lower half with no phase shifters is called a transmission mask region. In the phase shifting mask region of this arrangement, every other space part shifts the phase of the light passing therethrough by 180 degrees. In the transmission mask region, the space parts do not shift the phase of the light passing therethrough.

Figure 12:
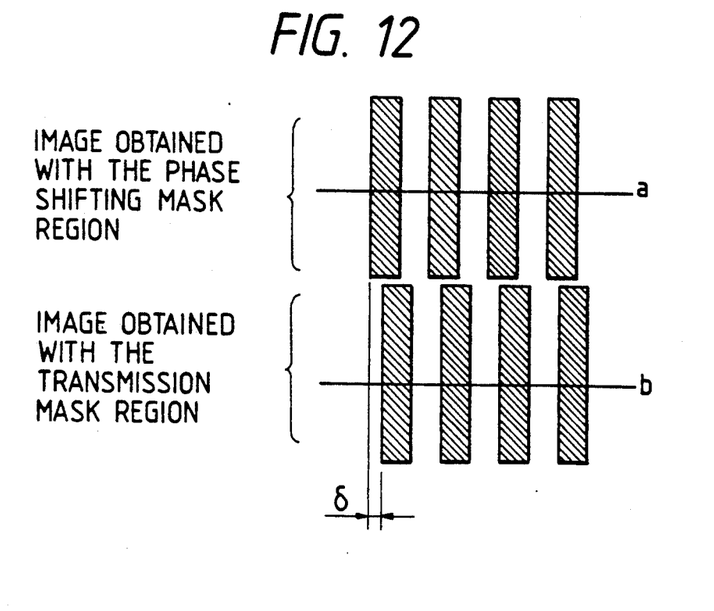
FIG. 12 is a view of a projection image obtained from the phase difference pattern of FIG. 11.

When the image of the above-described phase difference pattern 501 on the detecting plane 24 is known, the amount of defocus Δz (amount of focal plane shift in Z axis direction relative to detecting plane 24) is grasped precisely. Specifically, a tilt controller 102 controls the tilt angle of the plane mirror 101 so as to incline from perpendicular the incidence angle of the light entering the phase difference pattern 501. If the amount of defocus is other than zero, there occurs an image shift δ between the image of the transmission mask region and the image of the phase shifting mask region on the detecting plane 24, as shown in FIG. 12. It is assumed that the light entering the phase difference pattern 501 is on a plane substantially perpendicular to the longitudinal direction of the line pattern 112. Where the pitch L in which the line parts 112 and space parts 111 are arranged is close to the critical resolution of the reduction projection lens 6, the amount of image shift δ is proportional to the amount of defocus Δz. Thus when the amount of image shift δ is detected by the image sensor 12, with the stage 13 controlled in the Z axis direction in such a manner as to eliminate the image shift δ, the detecting plane 24 is made precisely to coincide with the focal plane of the reduction projection lens 6. That is, the detecting plane 24 is accurately compensated to come into focus.

With the detecting plane 24 thus brought into focus, the circuit device patterns on the reticle 3 are now ready for projection onto the surface of the wafer 7. For pattern projection, the detecting plane 24 is held in its focused state in the Z axis direction (i.e., Z stage 13 fixed in its Z axis position). In that state, the stages 14 and 15 are moved on the X-Y plane appropriately to position the wafer 7 in the imaging region of the reduction projection lens 6. This allows the pattern imaging plane to coincide precisely with the surface of the wafer 7. In this manner, the surface of the wafer 7 is focused with high precision relative to the pattern forming plane quickly and automatically as required for pattern projection.

How the amount of defocus Δz is related to the amount of image shift δ will now be considered. Initially, the intensity distribution of the light passing through the phase difference pattern 501 is obtained. The pattern f(x) of the transmitting light is a pattern made of line parts (intensity: 0) and space parts (intensity: 1) alternately repeated. If the horizontal axis is taken on the X axis and the repetitive period is 2L, as shown in FIG. 11, the transmitting light pattern f(x) is given by equation (1) below based on Fourier transformation. In the discussion that follows, the coherency σ is assumed to be zero for the sake of simplified analysis. The angle of an incident light cone relative to the wafer 7 is represented by α, and the numerical aperture of the reduction projection lens 6 by NA.

$$f(x) = \sum_{n=-\infty}^{\infty} C_n \exp(n\pi x j/L) \quad (1)$$

$$C_n = (1/2L) \int_{-L}^{+L} f(x)\exp(-n\pi xj/L)dx$$

As shown in FIG. 11, f(x) is zero for the line parts $(-3L/4 < X < -L/4)$ and $(+L/4 < X < +3L/4)$ within one period 2L ($-L$ through $+L$). For the space parts $(-L < X < -3L/4)$, $(-L/4 < X < +L/4)$ and $(+3L/4 < X < +L)$, f(x) is expressed by a function $\exp(j\phi)$ containing the phase $\phi$ that varies depending on the presence or absence of phase shifters 113. The equation is:

$$f(x) = \exp(j\phi); (-L < x < -3L/4), (+3L/4 < x < +L) \quad (2)$$

$$f(x) = 1; (-L/4 < x < +L/4)$$

Substituting equation (2) with equation (1) turns Cn into the following:

$$C_n = (1/n\pi)\{\sin(n\pi/4) - \exp(j\phi)\sin(3n\pi/4)\}; \quad (3)$$
where, $n \neq 0$ $$C_n = (1/4)\{1 + \exp(j\phi)\};$$
where, $n = 0$ The transmitting light pattern f(x) of the phase difference obtained as above is projected via the reduction projection lens 6 onto the detecting plane 24 provided on the stage 13.

The amount of image shift on the detecting plane 24 is obtained in two parts: the amount of image shift $\delta_1$ in the phase shifting mask region, and the amount of image shift $\delta_2$ in the transmission mask region. The positions of the two pattern images are compared, and the result of the comparison allows the amount of image shift δ to be acquired.

(1) How to obtain the image shift of the phase shifting mask region

First, a complex amplitude distribution function U(x) about the image on the detecting plane 24 is acquired using the Fourier transformation F(v) of the transmitting light pattern f(x). The function is given by the equation (4) below. The variable (v) in the equation stands for coordinates on the entrance pupil plane of the reduction projection lens 6.

$$U(x) = \int_{-\infty}^{\infty} F(v)\exp(2\pi jvx)dv \quad (4)$$

On the entrance pupil plane, the position of the light source is assumed to have moved by $v'$ by inclination of the incident light (i.e., optical axis tilt angle $\theta$). Given such source position displacement and with the amount of defocus taken into account, the function U(x) is changed as follows:

$$U(x) = \int_{-\infty}^{\infty} F(v)\exp(2\pi jw(v))\exp(2\pi jx)dx \quad (5)$$

F(v) in equation (5) is given as $$F(v) = C_0(v - v') + C_1\{\delta(v + v_0/2 - v') + \delta(v - v_0/2 - v')\} + C_2\{\delta(v + 2v_0/2 - v') + \delta(v - 2v_0/2 - v')\} + C_3\{\delta(v + 3v_0/2 - v') + \delta(v - 3v_0/2 - v')\} \quad (6)$$

where, $v_0 = 1/L$. The source position displacement is given as $$v' = v/(m\theta)$$

where, m (e.g., 1/5) is the demagnification of the reduction projection lens 6, λ is the wavelength of the incidence light, and $\theta$ is the optical axis tilt angle. The value w(v) in equation (5) represents the wave front aberration resulting from the amount of defocus Δz in effect when the reduction projection lens 6 is considered an aberration-free lens. This is expressed as follows:

$$W(v) = Dv^2; \quad (7)$$
$$(\text{where, } D = -\lambda\Delta z/2)$$

The value Cn in the above equation is called a spectrum component coefficient of degree n/2.

Suppose that with F(v) above, spectrum components of degrees 0 and ±1/2 pass through the entrance pupil. In such cases, the complex amplitude distribution function U(x) is given by the following equation:

$$U(x) = \exp\{2\pi jv'(Dv' + x)\} \cdot [\{1 + \exp(j\phi)\}/4 + \quad (8)$$
$$(\sqrt{2}/\pi)\{1 - \exp(j\phi)\}\exp(\pi jDv_0^2/2)\cos\{\pi v_0(x + 2Dv')\}]$$

From the function U(x) above, the light intensity distribution function I(x) is expressed as follows:

$$I(x) = |U(x)|^2 = (1 + \cos\phi)/8 + \quad (9)$$
$$(2/\pi^2)(1 - \cos\phi)[1 + \cos\{2\pi v_0(x + 2Dv')\}] +$$

-continued $$(\sqrt{2}/\pi)\sin\phi \sin(\pi Dv_0^2/2) \cos\{\pi v_0(x + 2Dv')\}$$

As mentioned above, the phase of the light passing through the phase shifter 113 of the phase difference pattern 501 is shifted by 180 degrees. Thus substituting $\phi = 180$ degrees in the equation (9) above provides:

$$I(x) = (4/\pi^2)[1 + \cos\{2\pi v_0(x + 2Dv')\}] \quad (10)$$

In equation (10), the second term in the cosine (cos) corresponds to the component $\delta_1$ ($\delta_1 = \Delta z \cdot v'$). That is, the component $\delta_1$ is the product of the amount of defocus $\Delta z$ and the amount of incident light axis displacement $v'$ on the entrance pupil plane of the reduction projection lens 6; the amount $v'$ is given when the optical axis of the incident light is tilted by the angle $\theta$.

Thus as discussed above, the amount of image shift δ indicated in FIG. 12 is given as $$\delta = \Delta z \cdot v'$$

That is, the value is independent of the pattern size.

(2) How to obtain the image shift of the transmission mask region

The amount of image shift of the transmission mask region is obtained basically in the same manner as above. In the course of acquiring the amount of image shift, equation (11) below is obtained in place of the equation (6) above, and equation (12) below is obtained in place of the preceding equation (10).

$$F(v) = (1/2)\delta(v - v') + (1/\pi)\{\delta(v + v_0 - v') + \delta(v - v_0 - v')\} \quad (11)$$

$$I(x) = (1/4) + (1/\pi)^2 + (1/\pi)\cos[2\pi v_0\{x - \Delta z(v' - v_0/2)\}] \quad (12)$$

Where $(v' - v_0/2) < 0$ in equation (12), there occurs an image shift in the X axis direction opposite to that of equation (10). This allows the value δ to be enlarged.

Figure 13:
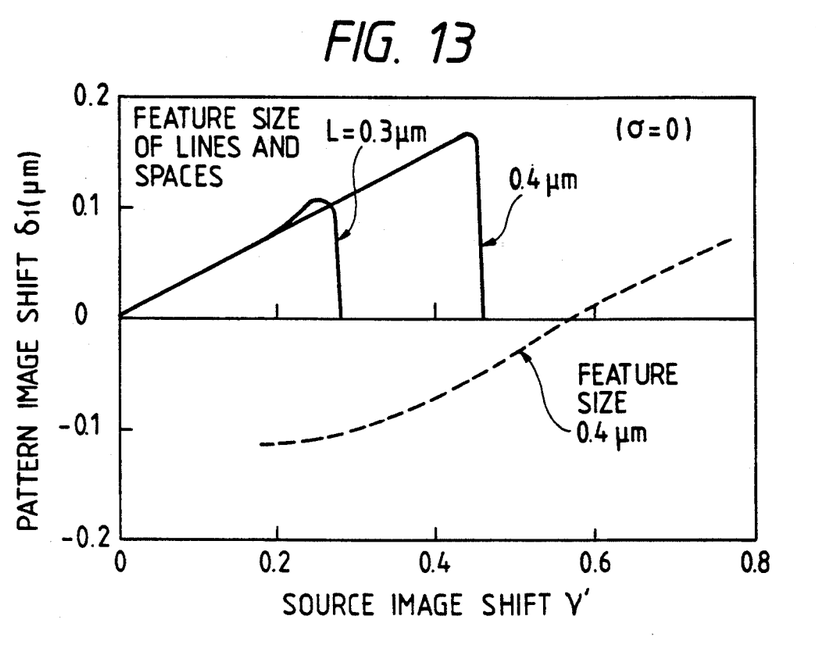
FIG. 13 is a graphic representation showing a typical relationship between the amount of pattern image shift and the amount of source image shift in connection with the invention.

FIG. 13 graphically shows simulated results of the relationship between the amount of pattern image shift and the amount of source image shift where the value of coherency $\sigma$ is zero. As illustrated, increasing the tilt angle $\theta$ of illumination light from zero upward raises correspondingly the amount of source image shift v' from zero upward on the horizontal axis The amount of pattern image shift of the phase shifting mask region increases proportionately, but drops abruptly to zero at a certain point, as indicated by solid line in FIG. 13. This is because once the tilt angle $\theta$ exceeds that point the spectrum component of degree $-\frac{1}{2}$ or $+\frac{1}{2}$ disappears and the contrast falls to zero.

The amount of image shift $\delta_2$ of the transmission mask region, indicated by broken line, increases at a similar gradient, and changes from negative to positive values in the neighborhood of $$v' = v_0/2$$

Thus in the range of $v' < v_0/2$, the image shift of the transmission mask region occurs in the direction opposite to that of the image shift of the phase shifting mask region.

The greater the difference between the two amounts of image shift ($\delta_1 - \delta_2$), the higher the sensitivity available for focusing. For example, where the line/space size L is 0.4 μm, the tilt angle $\theta$ of the optical axis of illumination light should preferably be set so that the amount of source image shift $v'$ falls within a range of 0.2 $v_0$ through 0.4 $v_0$.

Figure 14:
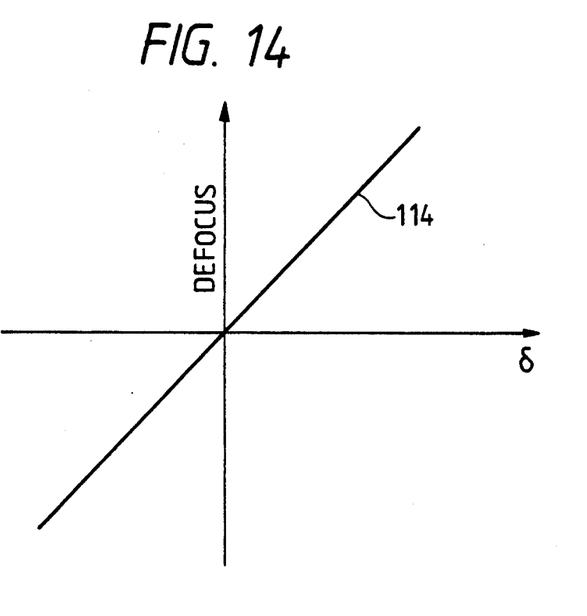
FIG. 14 is a graphic representation indicating a typical relationship between the amount of pattern image shift and the amount of defocus.

When the pitch of the phase difference pattern 501 near the critical resolution is represented by $P_0$ and the demagnification of the reduction projection lens 6 by m, the tilt angle $\theta$ falls within the range of $$|\theta| \leq |\cdot NA - \lambda \cdot |m||/(2P_0)$$

on condition that the contrast of the image in the phase shifting mask region is not to drop precipitously.

Where the tilt angle $\theta$ is established in the above manner, there occurs a proportionate relationship between the amount of image shift $\delta$ and the amount of defocus $\Delta z$ as indicated by straight line 114 in FIG. 14. In operation, the image sensor (CCD sensor) 12 and the calculation part 19 of FIG. 10 are used to detect the amount of image shift $\delta$. The detected data are sent to the controller 20. In turn, the controller 20 controls the position of the stage 13 in the Z axis direction so that the amount of image shift $\delta$ becomes zero. This makes it possible to bring the focal plane of the reduction projection lens 6 and the detecting plane 24 into focus in a single stroke. Thus the embodiment of the invention accomplishes focusing much more rapidly than conventional apparatuses in which the Z stage 13 is scanned in the Z axis direction for focusing.

Figure 15:
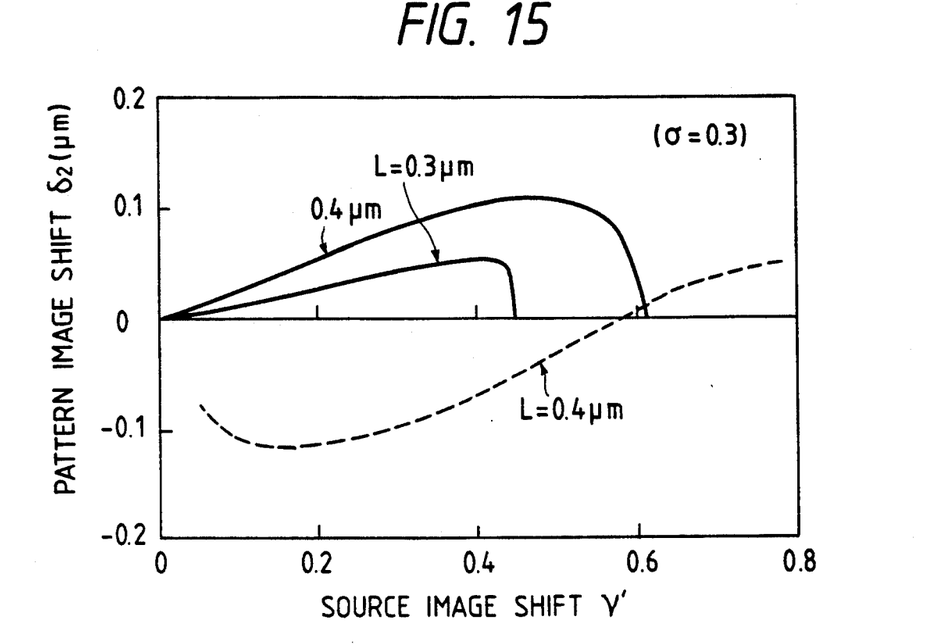
FIG. 15 is a graphic representation depicting another relationship between the amount of pattern image shift and the amount of source image shift in connection with the invention.

FIG. 15 graphically depicts simulated results of the relationship between the amount of pattern image shift and the amount of source image shift when the coherency value $\sigma$ is 0.3. This arrangement has a lower contrast of the projected image of the phase shifting mask region than the arrangement of FIG. 13. Although the gradients of the characteristic curves in FIG. 15 are slightly gentler, the basic trends are the same as those of FIG. 13. Thus the arrangement of FIG. 15 is used sufficiently to achieve focusing with enhanced efficiency.

Figure 16:
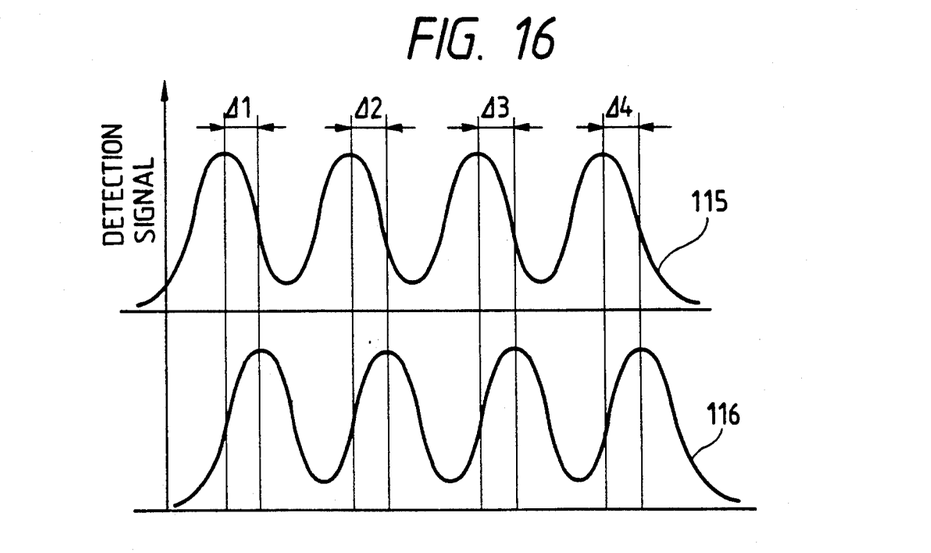
FIG. 16 is a graphic representation showing a typical relationship between the light intensity distribution of two pattern images and the amount of image shift therebetween in connection with the invention.

FIG. 16 graphically shows typical waveforms of detection signals derived from projection images of the phase difference pattern 501, the signals being provided by the image sensor ( CCD sensor ) 12. In FIG. 16, curves 115 and 116 correspond to the signals of the detected patterns on lines a and b in FIG. 12, respectively. The phase differences $\Delta_1 - \Delta_4$ between these two detection signals each correspond to the amount of image shift ($\delta_1 - \delta_2$). When the mean value of these phase differences is obtained, the value may be used as the amount of image shift ($\delta_1 - \delta_2$). When the magnification of the magnifying optics 11 is raised, the accuracy of detecting the phase differences $\Delta_1 - \Delta_4$ is also improved. This further enhances the precision of focusing.

Figures 17, 18, 19:
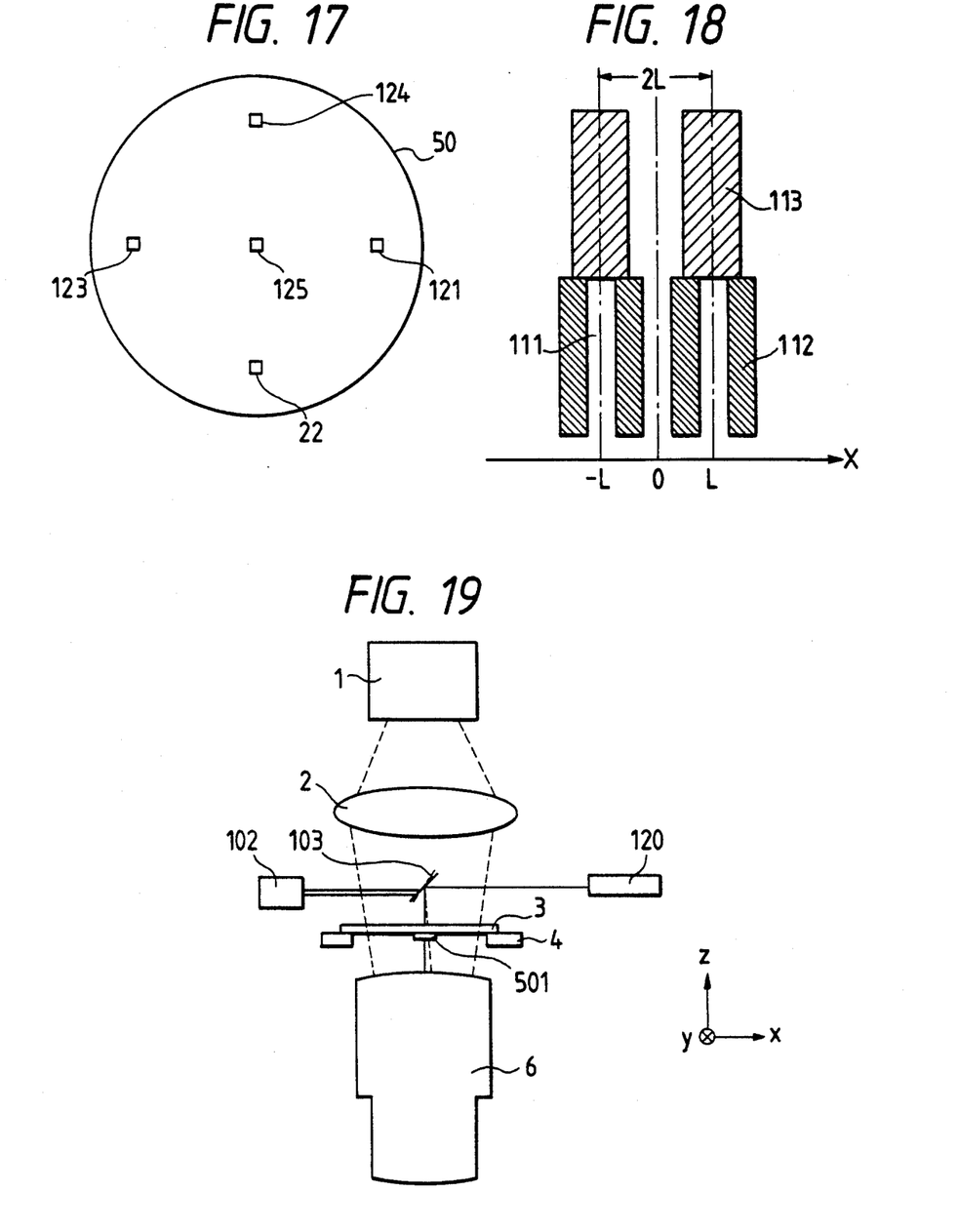
FIG. 17 is a view of a typical arrangement of phase difference patterns in connection with the invention.
FIG. 18 is a view of another phase difference pattern for use with the second embodiment.
FIG. 19 is a block diagram of a pattern forming apparatus practiced as a third embodiment of the invention.

FIG. 17 illustrates a case where a plurality of phase difference patterns 501 are located in a dispersed manner (e.g., at points 121 through 125) inside an exposure field 50. The best focal plane is obtained from the multiple patterns. In this case, the stage 13 comprises tilt control means whereby the detecting plane 24 is made to coincide with the best focal plane.

FIG. 18 shows another phase difference pattern 501 for use with the second embodiment. The difference of the phase difference pattern 501 of FIG. 18 from the pattern of FIG. 11 is that opaque line marks are not contained in the phase shifting mask region of the pattern in FIG. 18. Because the phase shifters 113 are arranged periodically, the pattern pitch in FIG. 18 is the same as that in FIG. 11. Thus the data about the amount of image shift are the same as those obtained where the pattern of FIG. 11 is utilized.

In the second embodiment of FIG. 10, the illumination optics for illuminating the phase difference pattern 501 and the plane mirror 101 for tilting the incidence angle of illumination light constitute an optics arrangement for projecting circuit device patterns. An alternative to this arrangement is to use a dedicated source 120 and a plane mirror 103 for illuminating the phase difference pattern 501 alone. This alternative is feasible because the incidence angle of illumination light need only be adjusted when the phase difference pattern 501 is illuminated in order to know the best focal plane. In the alternative case, the plane mirror 103 may either be tilted at a predetermined angle beforehand, or adjusted by the tilt controller 102 whenever required. Another alternative is to provide an optics moving mechanism for moving the above-mentioned dedicated illumination optics away from the optical axis of the reduction projection lens 6.

In case that the pattern forming apparatus as the first embodiment has the angle of its incident light fixed to the perpendicular, the reticle containing the phase difference pattern 501 of the second embodiment may be incorporated so as to detect the amount of projection image shift. The new setup is the third embodiment wherein the tilt error of the optical axis of the illumination optics is detected relative to the optical axis of the reduction projection lens 6.

The embodiments discussed above have all been practiced by applying the invention only to the reduction projection aligner for fine pattern projection. However, the invention is not limited to applications of the reduction projection aligner only; it may also be applied effectively to optical apparatuses such as wafer detectors which require focusing with high precision. The light for pattern projection in connection with the invention includes all light beams ranging from visible to X-ray regions as long as they have interference effect.

As described and according to the invention, the phase difference pattern containing phase difference information is located on the reticle or in the position equivalent thereto, and the image of the pattern is detected by the detector positioned where appropriate on the wafer stage. With this setup, the focal plane of the optical projection means is accurately detected, and the automatic focusing mechanism is calibrated quickly and precisely. When the focusing mechanism thus calibrated brings the wafer surface precisely into focus, it becomes possible to detect quickly and precisely that focal plane of the optical projection means which varies over time for accurate focusing. Adjusted in this manner, the optical projection means can bring its capability into full play in forming fine patterns precisely on the wafer. ,This provides for the manufacture of circuit devices of significantly high integration.

As many apparently different embodiments of this invention may be made without departing from the spirit and scope thereof, it is to be understood that the invention is not limited to the specific embodiments thereof except as defined in the appended claims.

What is claimed is:

1. A pattern forming method for projecting patterns of a first substrate onto the surface of a second substrate via optical projection means in order to form a projection image of said patterns on the second substrate surface, said method comprising the steps of:

furnishing a phase difference pattern on any one of a first and a second plane, said first plane being one where said patterns of said first substrate are located, said second plane being any plane equivalent to said first plane, said phase difference pattern affording a predetermined phase difference to the light passing, therethrough, and then irradiating light at said phase difference pattern via said optical projection means to project said phase difference pattern onto a detecting plane in the position equivalent to the surface of said second substrate, thus forming a projection image of said phase difference pattern on said detecting plane before said patterns are projected onto the surface of said second substrate;

detecting by use of optical detection means the light intensity distribution of said projection image of said phase difference pattern projected onto said detecting plane, the detected light intensity distribution being represented by detection signals;

subjecting said detection signals to signal processing so as to obtain the relative positional relationship between the focal plane of said patterns and said detecting plane by use of said optical projection means; and controlling the position of said second substrate so that the position of said detecting plane coincides with the position of said focal plane of said patterns on the basis of said relative positional relationship obtained.

2. A pattern forming method according to claim 1, wherein said optical detection means is furnished on a stage supporting said second substrate.

3. A pattern forming method according to claim 1, wherein said phase difference pattern is made of a plurality of phase difference pattern parts each affording a different phase difference to a light beam passing therethrough.

4. A pattern forming apparatus comprising:

optical projection means for projecting patterns of a first substrate onto a second substrate, any one of said first substrate and the equivalent thereof having a phase difference pattern, said phase difference pattern affording a phase difference to the light passing therethrough;

optical detection means for detecting a projection image of said phase difference pattern obtained by irradiating, via said optical projection means, a light beam of a predetermined wavelength at said phase difference pattern, said detection image being represented by detection signals;

calculation means for processing said detection signals from said optical detection means in order to calculate the position of said second substrate relative to the focal plane of said optical projection means, the relative position of said second substrate being represented by another signal; and control means for controlling the position of said second substrate on the basis of the signal from said calculation means.

5. A pattern forming apparatus according to claim 4, wherein said optical detection means is furnished on a stage supporting said second substrate.

6. A pattern forming apparatus according to claim 4, wherein said phase difference pattern is made of a plurality of phase difference pattern parts each affording a different phase difference to a light beam passing therethrough.

7. A pattern forming apparatus according to claim 4, further comprising incident angle adjusting means for adjusting the incident angles of light beams for illuminating said phase difference pattern.

8. A pattern forming apparatus according to claim 4, wherein said phase difference pattern comprises two pattern portions, one pattern portion being made of clear and opaque parts alternately arranged so as to afford no phase difference to the light passing therethrough, the other pattern portion being composed of clear and opaque parts alternately arranged, every other clear part having a phase shifter for shifting by substantially 180 degrees the phase of a light beam passing therethrough.

9. A pattern forming mask for use with a pattern forming apparatus, comprising a plurality of phase difference patterns arranged at a predetermined distance apart, said plurality of phase difference patterns being located inside of a region available for projection by optical projection means and outside of a region where patterns to be projected are located, each phase difference pattern affording a phase difference to a light beam passing therethrough.

* * * * *